(12) United States Patent
Lee

(10) Patent No.: US 9,231,097 B2
(45) Date of Patent: Jan. 5, 2016

(54) HVMOS TRANSISTOR STRUCTURE HAVING OFFSET DISTANCE AND METHOD FOR FABRICATING THE SAME

(71) Applicant: MediaTek Inc., Hsin-Chu (TW)

(72) Inventor: Ming-Cheng Lee, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 103 days.

(21) Appl. No.: 13/760,354

(22) Filed: Feb. 6, 2013

(65) Prior Publication Data

US 2013/0200445 A1  Aug. 8, 2013

Related U.S. Application Data

(60) Provisional application No. 61/595,921, filed on Feb. 7, 2012.

(51) Int. Cl.
| | |
|---|---|
| *H01L 29/66* | (2006.01) |
| *H01L 29/78* | (2006.01) |
| *H01L 29/417* | (2006.01) |
| *H01L 29/45* | (2006.01) |
| *H01L 29/49* | (2006.01) |
| *H01L 29/08* | (2006.01) |

(52) U.S. Cl.
CPC .......... *H01L 29/78* (2013.01); *H01L 29/41775* (2013.01); *H01L 29/66477* (2013.01); *H01L 29/66659* (2013.01); *H01L 29/66689* (2013.01); *H01L 29/0847* (2013.01); *H01L 29/0878* (2013.01); *H01L 29/456* (2013.01); *H01L 29/4933* (2013.01); *H01L 29/665* (2013.01)

(58) Field of Classification Search
CPC ............ H01L 29/6659; H01L 29/7833; H01L 29/665; H01L 29/6656
USPC .................. 257/288, 336, 344, 408
See application file for complete search history.

(56) References Cited

U.S. PATENT DOCUMENTS

| | | | |
|---|---|---|---|
| 6,548,874 B1 | 4/2003 | Morton et al. | |
| 8,614,484 B2 * | 12/2013 | Teo et al. | ........ 257/336 |
| 2010/0052057 A1 | 3/2010 | Chung et al. | |
| 2010/0237439 A1 | 9/2010 | Lee et al. | |
| 2011/0024839 A1 * | 2/2011 | Zinn et al. | ........ 257/343 |
| 2011/0108917 A1 | 5/2011 | Shima | |

FOREIGN PATENT DOCUMENTS

| | | |
|---|---|---|
| CN | 102110714 | 6/2011 |
| JP | 2001168210 | 6/2001 |

* cited by examiner

*Primary Examiner* — Monica D Harrison
(74) *Attorney, Agent, or Firm* — McClure, Qualey & Rodack, LLP

(57) ABSTRACT

An HVMOS transistor structure includes: a first ion well of a first conductivity type and a second ion well of a second conductivity type different from the first conductivity type formed over a substrate, wherein the first ion well and the second ion well have a junction at their interface; a gate overlying the first ion well and the second ion well; a drain region of the first conductivity type, in the first ion well, spaced apart from a first sidewall of the gate by an offset distance; and a source region of the first conductivity type in the second ion well. In addition, a method for fabricating the HVMOS transistor structure described above is also provided.

25 Claims, 7 Drawing Sheets

HVMOS TRANSISTOR STRUCTURE HAVING OFFSET DISTANCE AND METHOD FOR FABRICATING THE SAME

CROSS REFERENCE TO RELATED APPILCATIONS

This application claims the benefit of U.S. Provisional Application No. 61/595,921 filed on Feb. 7, 2012, entitled "Novel HVMOS structure," which application is hereby incorporated herein by reference.

BACKGROUND OF THE INVENTION

1. Field of the Invention

The invention relates to a semiconductor device, and in particular relates to an HVMOS and a method for fabricating thereof 2. Description of the Related Art High-voltage metal-oxide-semiconductors (HVMOS) are MOS devices for use with high voltages, which may be, but not limited to, voltages higher than the voltage supplied to the I/O circuit. HVMOS devices may function as switches and are broadly utilized in audio output drivers, CPU power supplies, power management systems, AC/DC systems, LCD or plasma television drivers, automobile electronic components, PC peripheral devices, small DC motor controllers, and other consumer electronic devices.

FIG. 1 shows a cross-sectional view of a conventional high-voltage NMOS transistor structure. The high-voltage NMOS (HVNMOS) transistor structure 101 includes a gate 105 overlying an area of a P-type substrate 100, a deep N-well 110 formed in the P-type substrate 100, an N-well 120 formed in the substrate 100 proximate to a first sidewall 105a of the gate 105, and a P-well 130 formed in the P-type substrate 100 proximate to a second sidewall 105b of the gate 105 opposite to the first sidewall 105a, wherein a P-N junction 140 is formed at the interface between the N-well 120 and the P-well 130. The P-well 130 has an overlapping area with the gate 104 which is larger than that of the N-well 120. An N+ drain region 150 is in the N-well 120 and aligned to the first sidewall 105a of the gate 104. An N-type source region 155 includes an N+ region 155a and an N-type lightly doped region 155b formed in the P-well 130.

The above-described HVNMOS transistor structure 100 can tolerate high voltages introduced from the N+ drain region. However, since the size of IC devices continue to shrink via new generation technologies, the above-described HVNMOS transistor structure 100 is not suitable for advanced ICs having a reduced gap between the P-N junction and the N+ drain region. A highly dosed N-type dopant in the N+ drain region is prone to diffuse the P-N junction 140 and the gate 104 due to the reduced gap between the P-N junction 140 and the N+ drain region 150, which results in a more serious hot carrier injection (HCI) effect and degraded time-dependent dielectric breakdown (TDDB).

BRIEF SUMMARY OF INVENTION

Accordingly, an HVMOS transistor structure is provided. The HVMOS transistor structure includes: a first ion well of a first conductivity type and a second ion well of a second conductivity type different from the first conductivity type formed over a substrate, wherein the first ion well and the second ion well have a junction at their interface; a gate overlying the first ion well and the second ion well; a drain region of the first conductivity type, in the first ion well, spaced apart from a first sidewall of the gate by an offset distance; and a source region of the first conductivity type in the second ion well.

Furthermore, a method for fabricating an HVMOS transistor structure is also provided. The method includes forming a first ion well of a first conductivity type and a second ion well of a second conductivity type different from the first conductivity type in a substrate, wherein the first ion well and the second ion well have a junction at their interface; forming a gate overlying the first ion well and second ion well; and forming a drain region of the first conductivity type in the first ion well, wherein the drain region is spaced apart from a first sidewall of the gate by an offset distance.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The present invention has been particularly shown and described with respect to certain embodiments and specific features thereof The embodiments set forth hereinbelow are to be taken as illustrative rather than limiting. It should be readily apparent to those with ordinary skill in the art that various change and modifications in form and detail may be made without departing from the spirit and scope of the invention.

Figure 1:
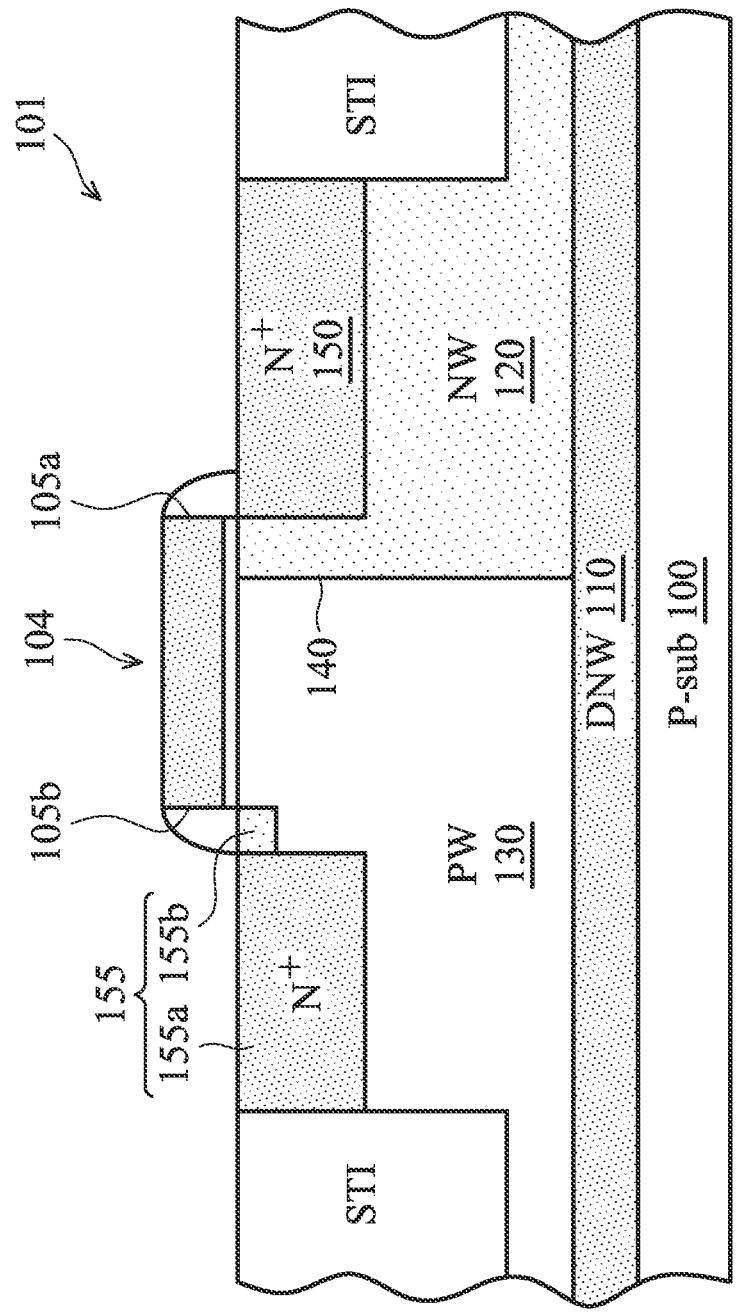
FIG. 1 shows a cross-sectional view of a conventional high-voltage NMOS transistor structure.
Figure 2A:
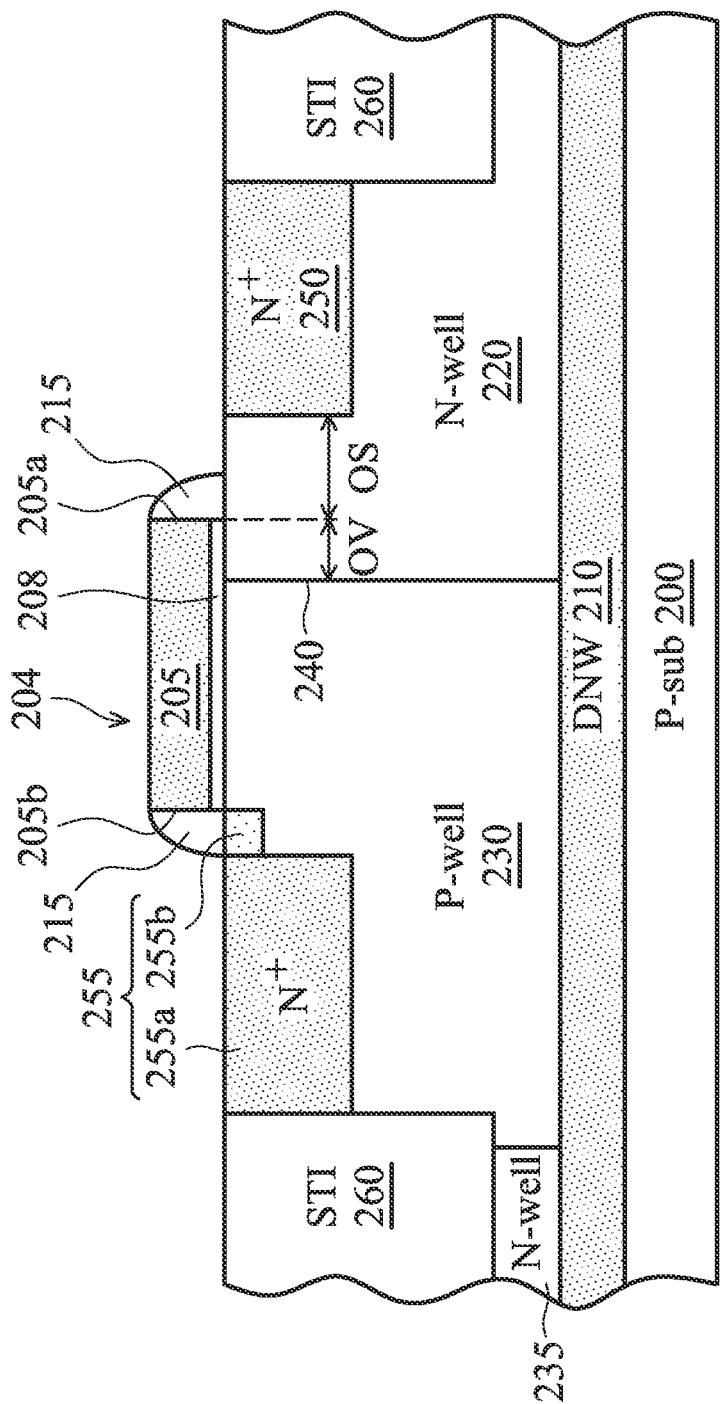
FIGS. 2A-2E shows various stages of an exemplary method for fabrication of the HVNMOS transistor structure in accordance with an embodiment of the present invention.
Figure 2B:
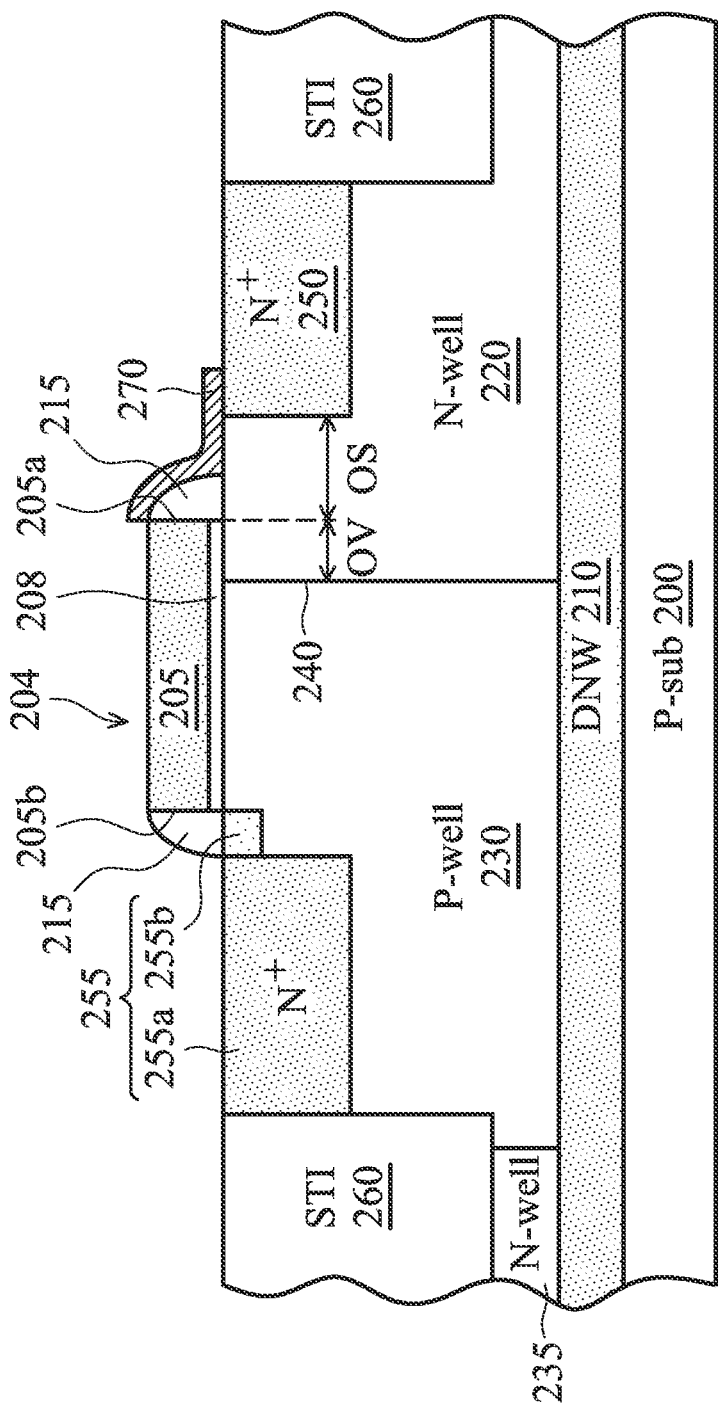
Figure 2C:
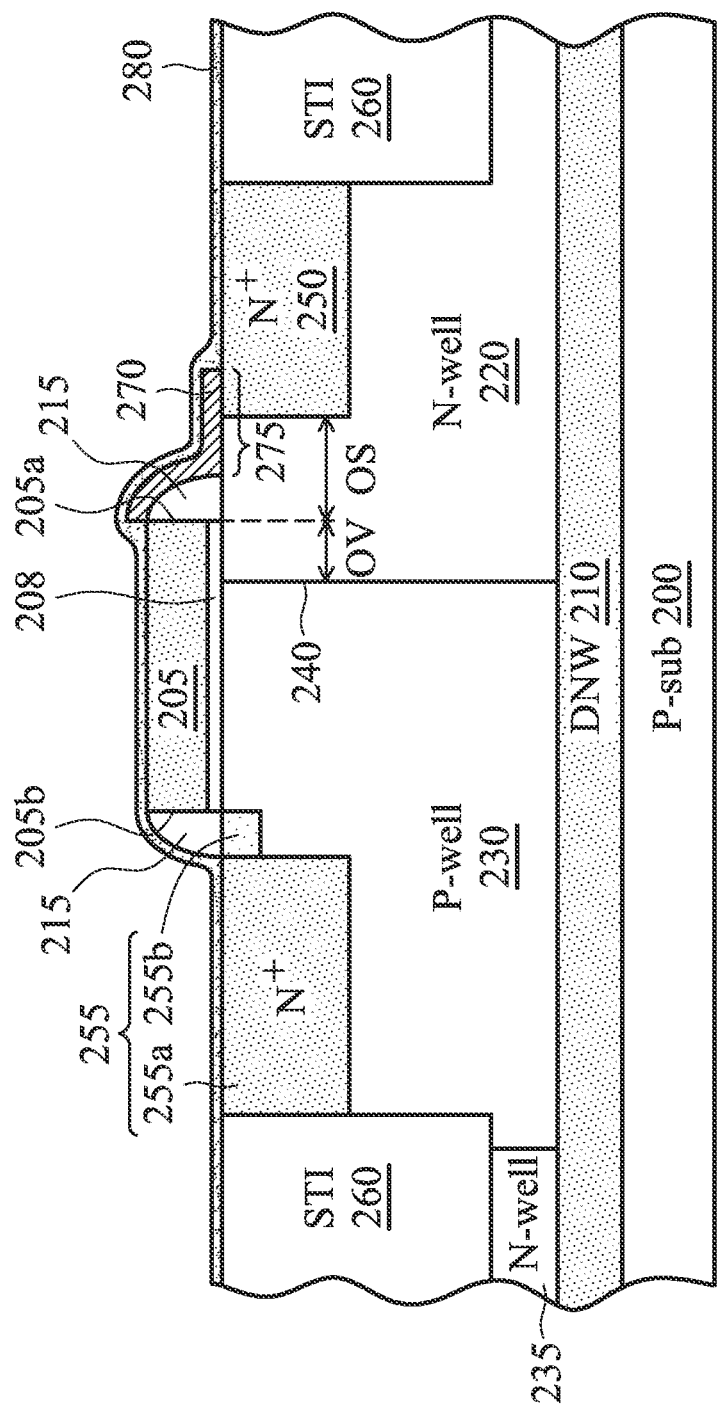
Figure 2D:
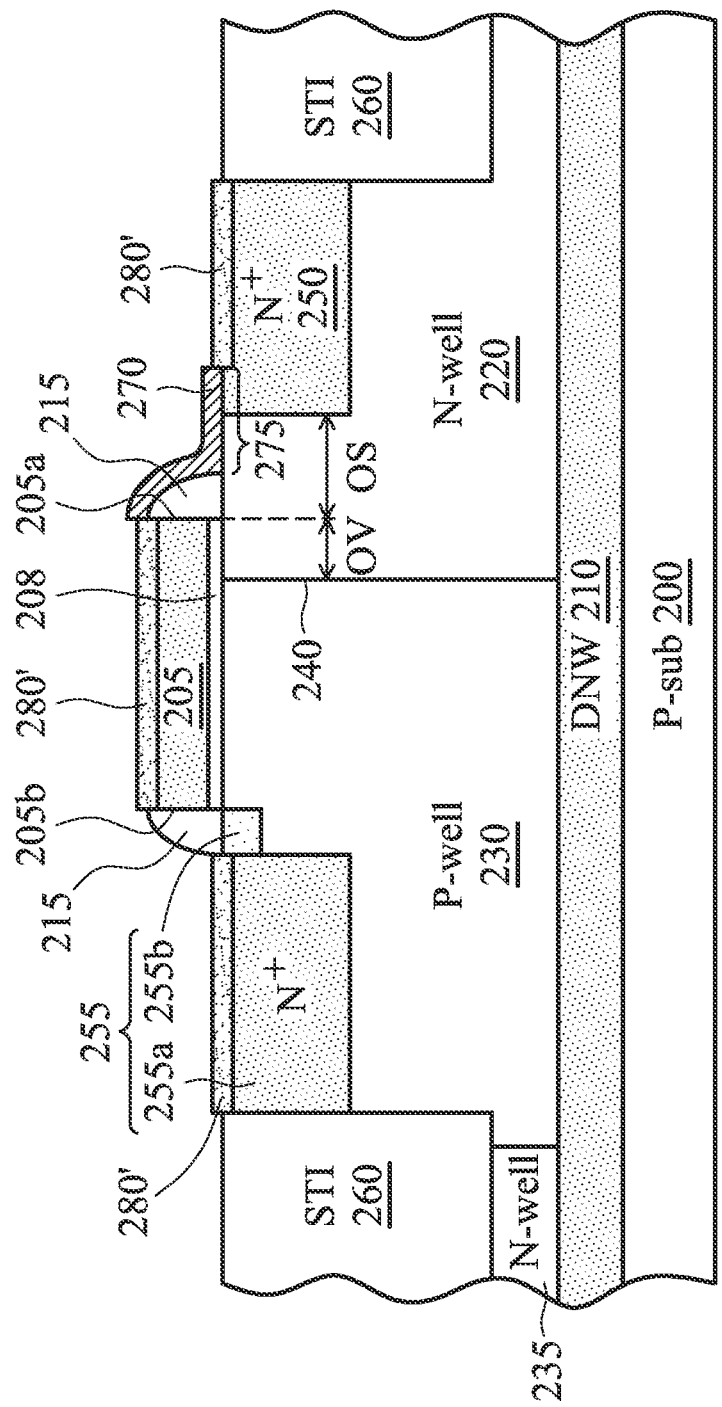
Figure 2E:
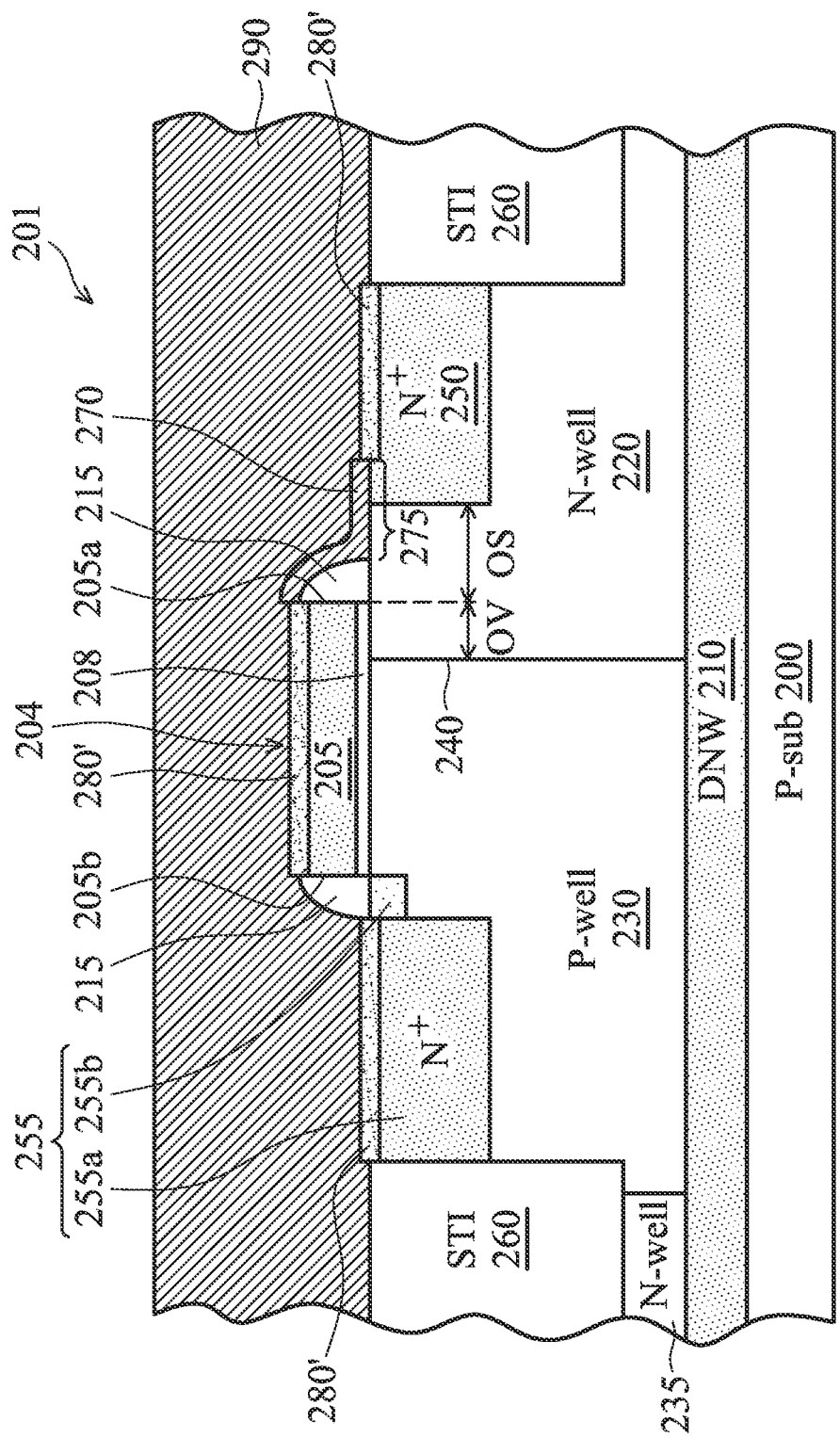

FIG. 2E shows a cross-sectional view of an exemplary HVNMOS transistor structure according to an embodiment of the present invention. The HVNMOS transistor structure 201 may comprise a substrate 200, a first ion well 220 of a conductivity type and a second ion well 230 of a second conductivity type different from the first conductivity type over the substrate 200, and a gate 204 overlying the first ion well 220 and the second ion well 230. The substrate 200 may be a P-type substrate. The first ion well 220 may be an N-well doped with a first concentration of an N-type dopant and be proximate to a first sidewall 205a of the gate 204. The second ion well 230 may be a P-well doped with the first concentration of a P-type dopant and be proximate to a second sidewall 205b of the gate 204. In some embodiments, the first concentration may be 1E13~1E14 cm$^{-2}$. The first ion well 220 and the second ion well 230 may be adjacent to each other, forming a P-N junction 240 at their interface. The first ion well 220 and the second ion well 230 may be surrounded and defined by isolations 260 such as hallow trench isolation (STI) regions or other suitable isolation features.

The gate 204 may comprise a gate electrode 205 formed on a gate dielectric layer 208. Gate spacers 215 may be formed on the sidewalls of the gate 204. The gate electrode 205 may comprise polysilicon, metal or other suitable materials. The gate dielectric layer 208 may comprise an oxide or high-k dielectrics. In an embodiment, the high-k dielectrics may be HfO$_2$, LaO, Ta$_2$O$_5$, Y$_2$O$_3$, SrTiO$_3$(STO), BaTiO$_3$, BaZrO, HfZrO, HfLaO, HfSiO, LaSiO, AlSiO, HfTaO, HfTiO, (Ba, Sr)TiO$_3$(BST), or a combination thereof. The gate spacers 215 may be oxides, oxynitride, or a combination thereof. In an embodiment, the gate 204 may be asymmetrically disposed on the first ion well 220 and the second ion well 230. For instance, the gate 204 may have a first overlapping length (OV) with the first ion well 220 and a second overlapping length with the second ion well 230, respectively. The first overlapping length is from the P-N junction 240 of the first and second ion wells to the first sidewall 205a of the gate 204, and the second overlapping length is from the P-N junction 240 of the first and second ion wells to the second sidewall 205b opposite to the first sidewall 205a. The first overlapping length is smaller than the second overlapping length. In other words, the gate 204 may have a relatively smaller overlapping area with the first ion well 220 and have a relatively larger overlapping area with the second ion well 230. In an embodiment, the first overlapping length (OV) may be between about 0.1 μm and about 0.3 μm.

A drain region 250 and a source region 255 of the first conductivity type may be formed in the first ion well 220 and the second ion well 230, respectively. In an embodiment, the drain region 250 and the source region 255 may be an N+ region which has a second doped concentration of an N-type dopant higher than that of the first ion well 220 and the second ion well 230. For example, the second doped concentration may be about 3E15~3E16 cm$^{-2}$. The drain region 250 may be spaced apart the first sidewall 205a of the gate 204 by an offset distance (OS). In an embodiment, the offset distance (OS) may be between about 0.2 and about 0.5 μm, or between about 0.2 and about 0.4 μm, or about 0.3 μm. The offset distance (OS) may provide an extra gap to provide a high resistive area and to prevent or reduce the highly dosed dopant from diffusing to the gate dielectric layer 208 and/or the P-N junction 240 from the drain region 250. Therefore, the voltage drop of the drain side is increased and the time dependent dielectric breakdown (TDDB) of the gate dielectric layer 208 between the gate 204 and the drain region 250 is improved. In addition, the quality of the P-N junction 240 of the first ion well 220 and the second ion well 230 can be maintained, and the hot carrier injection (HCI) effect can be therefore reduced. The source region 255 may comprise an N+ region 255a having the second doped concentration and an N-type lightly doped region 255 substantially aligned to the second sidewall 205b of the gate 204.

A silicide layer 280' may be formed over the gate electrode 205, the source region 255 and a portion of the drain region 255. In other words, an unsilicided region 275 extending from the spacer 215 on the first sidewall 205a of the gate 204 to a portion of the drain region 250 that is not covered by the silicide layer 280' is left. In an embodiment, the unsilicided region may have a length of between 0.1~0.5 um. The silicide layer 280' may be an alloy of silicon and metals, used as contact materials in silicon device manufacturing, e.g., TiSi$_2$, CoSi$_2$, NiSi, other silicide, or any combinations thereof. A resist protect oxide (RPO) layer 270 may be formed with covering the unsilicided regions 275. An interlayer dielectric (ILD) layer 290 may be formed over the silicide layer 280' and the RPO layer 270. In an embodiment, the ILD layer 290 and the RPO layer 270 may comprise silicon dioxide or other suitable dielectric materials. The RPO layer 270 which covers the unsilicided region 275 may prevent the silicide layer 280' from being formed over the unsilicided region 275 and be capable of blocking the drain-to-gate current or drain-to-junction current transportation via the upper surface of the drain region 250 and the first ion well 220 such that the field between the drain 250 and the P-N junction 240 can be further improved.

In an embodiment, a deep well 210 of the first conductivity type may be optionally formed underlying the first ion well 220 and the second ion well 230. In some embodiments, a third ion well 235 of the first conductivity type, such as an N-well, may be optionally formed adjacent to the second ion well 230 and under the STI 260.

FIGS. 2A-2E illustrates cross-sectional views at various stages of an exemplary method for fabrication of the HVN-MOS transistor structure in accordance with an embodiment of the present invention. FIG. 2A shows a gate 204 overlying a first ion well 220 (e.g., P-well) of a first conductivity type and a second ion well 230 of a second conductivity type different from the first conductivity type. The first ion well 220 and the second ion well 230 (e.g., N-well) may be adjacent to each other, forming a P-N junction 240 at their interface. The gate 204 may have a first overlapping length (OV) with the first ion well 220 and a second overlapping length with the second ion well 230, respectively. The first overlapping length is from the P-N junction 240 of the first and second ion wells to the first sidewall 205a of the gate 204, and the second overlapping length is from the P-N junction 240 of the first and second ion wells to the second sidewall 205b opposite to the first sidewall 205a. The first overlapping length is smaller than the second overlapping length. For example, the first overlapping length (OV) may be between about 0.1 μm and about 0.3 μm. An N+drain region 250 and a source region 255 may be formed in the first ion well 220 and the second ion well 230, respectively. The N+drain region 250 may be spaced apart from the sidewall 205a of the gate 204 by an offset distance (OS) so that the TDDB and the HCI effect are improved. The offset distance (OS) may be between about 0.2 and about 0.5 μm, or between about 0.2 and about 0.4 μm, or about 0.3 m. The source region 255 may comprise an N+region 255a and an N-type lightly doped region 255 substantially aligned to the second sidewall 205b of the gate 204. The source/drain regions 250, 255 may be formed by suitable implantation processes. In addition, a deep N-well 210 and a third ion well 235 (e.g., N-well) may be optionally formed.

Referring to FIG. 2B, a mask layer is deposited onto the substrate and partially etched, leaving an RPO layer 270 over the spacer 215 on the first sidewall 205a of the gate 204 and extending to a portion of the N+ drain region 250. The RPO layer 270 may be silicon dioxide or other suitable oxides and can be defined by applying wet etch or dry etch methods.

Referring to FIG. 2C, a metal layer 280 covering the gate 204, the source region 255, the drain region 250, and the RPO layer 270 may be formed. The metal layer 280 may be nickel, cobalt, titanium, or a combination thereof. Then, referring to FIG. 2D, a silicide process is performed to form a silicide layer 280' on the source region 255, the gate 204, and a portion of the drain region 250 that is not covered by the RPO layer 270. An unsilicided region 275 extending from the spacer 215 on the first sidewall 205a to the portion of the drain region 250 that is covered by the RPO layer 270 is left. The RPO layer 270 over the unsilicided region 275 may be capable of blocking the drain-to-gate current or drain-to-junction current transported via the upper surface of the drain region 250 and the first ion well 220 such that the field between the drain 250 and the junction 240 can be further improved. After forming the silicide layer 280', the remaining unsilicided portions of the metal layer 280 are removed.

FIG. 2E shows an interlayer dielectric (ILD) layer 290 being formed over the substrate. The interlayer dielectric layer 290 may be silicon dioxide or other suitable oxides. The interlayer dielectric layer 290 may use same or different materials with that of the RPO layer 270.

Figure 3:
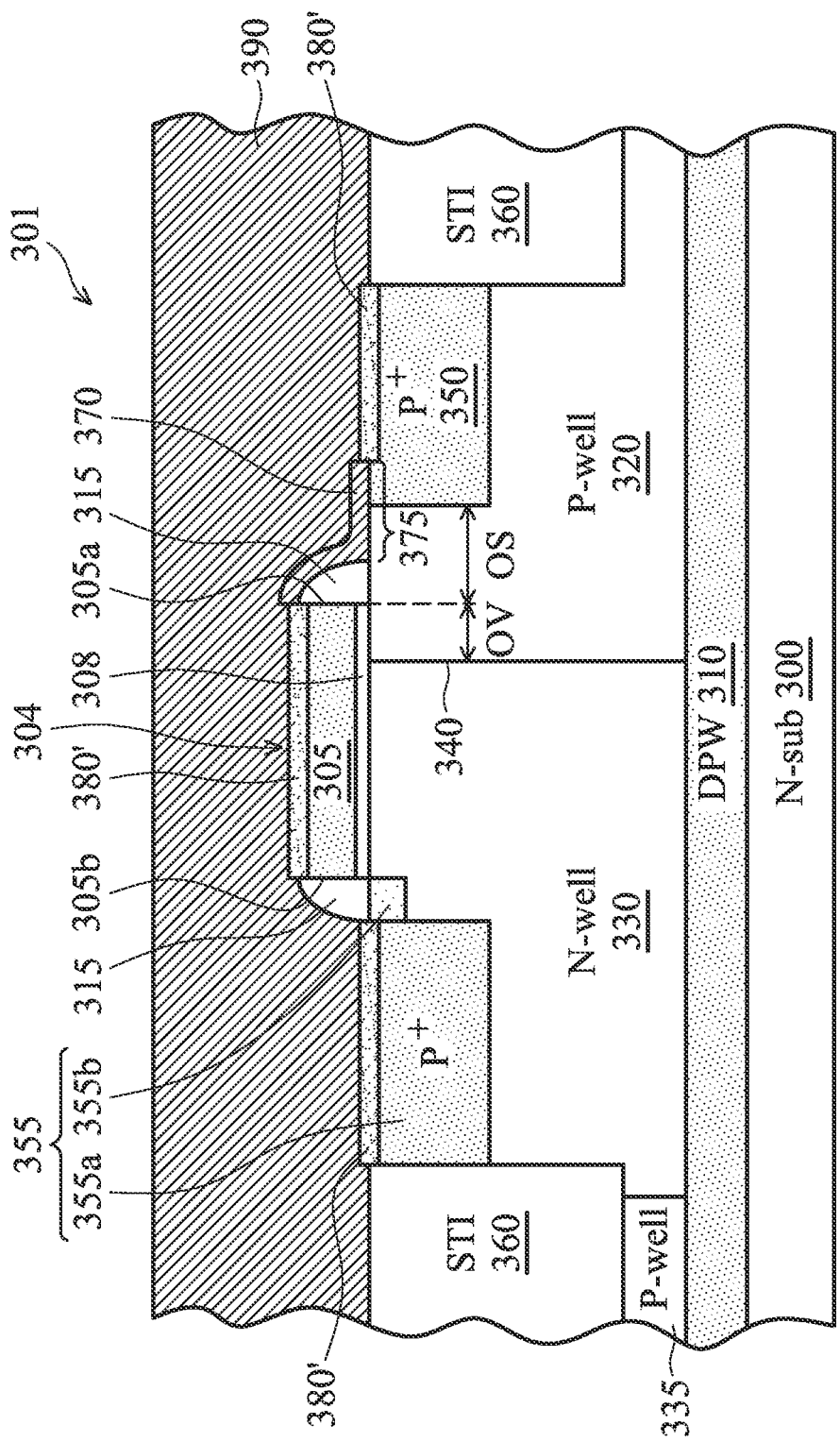
FIG. 3 shows a cross-sectional view of an exemplary HVPMOS structure according to an embodiment of the present invention.

The above exemplary structures of the HVMOS transistor structure are described for an HVNMOS transistor structure, but it should be understood by those skilled in the art that the polarity of the conductive dopant can be reversed. For example, FIG. 3 shows a cross-sectional view of an exemplary HVPMOS transistor structure according to one or more embodiments of the present invention. The HVPMOS transistor structure is similar with the HVNMOS transistor structure described above except that the first conductivity type and the second conductivity type are a P-type and the N-type, respectively For example, the HVPMOS transistor structure 301 may comprise a gate 304 formed overlying a P-well 320 and an N-well 330 in an N-type substrate 300. The P-well 320 and the N-well 330 may be adjacent to each other, forming a P-N junction 340 at their interface. The gate 304 may have a first overlapping length (OV) with the P-well 320 and a second overlapping length with the N-well 330, respectively. The first overlapping length is from the P-N junction 240 of the P-well 320 and N-well 330 to the first sidewall 305a of the gate 204, and the second overlapping length is from the P-N junction 340 of the P-well 320 and N-well 330 to the second sidewall 305b opposite to the first sidewall 305a. The first overlapping length is smaller than the second overlapping length. A P+drain region 350 and a source region 355 may be formed in the P-well 320 and the N-well 330, respectively. Similar with the preceding embodiments, the P+drain region 350 may be spaced apart from the sidewall 305a of the gate electrode 305 by an offset distance (OS) to prevent or reduce the highly dosed dopant from diffusing from the P+drain region 350 to the P-N junction 340 and/or the gate 304 so that the TDDB and the HCI effect are improved. The offset distance (OS) may be between about 0.2 and about 0.5 μm, or between about 0.2 and about 0.4 μm, or about 0.3 μm. The source region 355 may comprise a P+region 355a and a P-type lightly doped region 355b substantially aligned to the second sidewall 305b of the gate 304. In an embodiment, a deep P-well 310 may be optionally formed underlying the P-well 320 and the N-well 330. In some embodiments, another P-well 335 may be formed adjacent to the N-well 330.

A silicide layer 380' may be formed over the gate electrode 305, the source region 255 and a portion of the drain region 300. An unsilicided region 375 from the spacer 315 on the sidewall 305a of the gate electrode 305 extending to a portion of the P+ drain region 350 that is not covered by the silicide layer 380' is left. An RPO 370 layer may be formed with covering the unsilicided region 375. An ILD layer 390 may be formed on the silicide layer 380' and covering the RPO layer 370. The RPO layer 370 over the unsilicided region 375 may be capable of blocking the drain-to-gate current or drain-to-junction current transported via the upper surface of the P+ drain region 350 and the P-well 320 such that the field between the drain 350 and the P-N junction 340 can be further improved. The ILD layer 390 and the RPO layer 370 may be formed of similar or different materials.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An HVMOS transistor structure comprising:
a first ion well of a first conductivity type and a second ion well of a second conductivity type different from the first conductivity type formed over a substrate, wherein the first ion well and the second ion well have a junction at their interface;
a gate overlying the first ion well and the second ion well, wherein the gate has a first overlapping length with the first ion well, from the junction of the first and the second ion wells to the first sidewall of the gate, wherein the first overlapping length is between about 0.1 μm and about 0.3 μm, wherein the gate has a second overlapping length with the second ion well, from the junction of the first and the second ion wells to a second sidewall opposite to the first sidewall, and wherein the second overlapping length is greater than the first overlapping length;
a drain region of the first conductivity type, in the first ion well, spaced apart from a first sidewall of the gate, which is proximate to the first ion well, by an offset distance; and
a source region of the first conductivity type in the second ion well.

2. The HVMOS transistor structure of claim 1, wherein the offset distance is between about 0.2 and about 0.5 μm.

3. The HVMOS transistor structure of claim 1, wherein the source and drain regions have a greater doping concentration that that of the first ion well and the second ion well.

4. The HVMOS transistor structure of claim 1, further comprising a resist protect oxide layer covering the unsilicided region.

5. The HVMOS transistor structure of claim 1, wherein the gate comprises polysilicon, metal or a combination thereof.

6. The HVMOS transistor structure of claim 1, further comprising a deep well of the first conductivity type underlying the first and the second ion wells.

7. The HVMOS transistor structure of claim 1, wherein the first conductivity type is N-type, and the second conductivity type is P-type.

8. The HVMOS transistor structure of claim 1, wherein the first conductivity type is P-type, and the second conductivity type is N-type.

9. The HVMOS transistor structure of claim 1, wherein the gate comprises a gate electrode formed on a gate dielectric layer.

10. The HVMOS transistor structure of claim 1, wherein the second ion well has a first concentration of about 1E13-1E14 cm$^{-2}$.

11. The HVMOS transistor structure of claim 1, wherein the drain region and the source region have a second doped concentration of about 3E15-3E16 cm$^{-2}$.

12. The HVMOS transistor structure claim 1, further comprising:
gate spacers formed on the first and second sidewalls of the gate; and
a silicide layer over the gate, the source region and a portion of the drain region;
an unsilicide region not covered by the silicide layer extends from the spacer on the first sidewall to another portion of the drain region that is not covered by the silicide layer.

13. An HVMOS transistor structure comprising:
a first ion well of a first conductivity type and a second ion well of a second conductivity type different from the first conductivity type formed over a substrate, wherein the first ion well and the second ion well have a junction at their interface;

a gate overlying the first ion well and the second ion well, wherein the gate has a first overlapping length with the first ion wells, from the junction of the first and the second ion well to the first sidewall of the gate, wherein the first overlapping length is between about 0.1 μm an about 0.3 μm, wherein the gate has a second overlapping length with the second ion well, from the junction of the first and the second ion wells to a second sidewall opposite to the first sidewall, and wherein the second overlapping length is greater than the first overlapping length.

a drain region of the first conductivity type, in the first ion well, spaced apart from a first sidewall of the gate, which is proximate to the first ion well, by an offset distance;

a source region of the first conductivity type in the second ion well gate spacers formed on the first and second sidewalls of the gate; and a silicide layer over the gate, the source region and a portion of the drain region;

an unsilicide region not covered by the silicide layer extends from the space one the first sidewall to another portion of the drain region that is not covered by the silicide layer.

14. A method for fabricating a transistor HVMOS structure, the method comprising:

forming a first ion well of a first conductivity type and a second ion well of a second conductivity type different from the first conductivity type in a substrate, wherein the first ion well and the second ion well have a junction at their interface;

forming a gate overlying the first ion well and second ion well, wherein the gate has a first overlapping length with the first ion well, from the junction of the first and the second ion wells to the first sidewall of the gate, wherein the first overlapping length is between about 0.1 μm and about 0.3 μm, wherein the gate has a second overlapping length with the second ion well, from the junction of the first and the second ion wells to a second sidewall opposite to the first sidewall, and wherein the second overlapping length is greater that the first overlapping length; and forming a drain region and a source region of the first conductivity type in the first ion well and in the second ion well, respectively, wherein the drain region is spaced apart from a first sidewall of the gate, which is proximate to the first ion well, by an offset distance.

15. The method according to claim 14, wherein the offset distance is between about 0.2 and about 0.5 μm.

16. The method according to claim 14, wherein the source and drain regions have a greater doping concentration that that of the first ion well and the second ion well.

17. The method according to claim 14, further comprising forming an interlayer dielectric layer over the silicide layer and the resist protect oxide layer.

18. The method according to claim 14, further comprising a deep well of the first conductivity type underlying the first and the second ion wells.

19. The method according to claim 14, wherein the first conductivity type is N-type, and the second conductivity type is P-type.

20. The method according to claim 14, wherein the first conductivity type is P-type, and the second conductivity type is N-type.

21. The method according to claim 14, wherein the gate comprises a gate electrode formed on a gate dielectric layer.

22. The method according to claim 14, wherein the second ion well has a first concentration of about 1E13-1E14 $cm^{-2}$.

23. The method according to claim 14, wherein the drain region and the source region have a second doped concentration of about 3E15-3E16 $cm^{-2}$.

24. The method according to claim 14, further comprising:

forming gate spacers on the first and second sidewalls of the gate;

forming a resist protect oxide layer over the spacer on the first sidewall and extending to a portion of the drain region;

forming a metal later over the gate, the source region and the drain region; and performing a silicide process to the metal layer to form a silicide layer on the gate, the source region and another portion of the drain region that is not covered by the resist protect oxide layer.

25. A method for fabricating a transistor HVMOS structure, the method comprising:

forming a first ion well of a first conductivity type and a second ion well of a second conductivity type different from the first conductivity type in a substrate, wherein the first ion well and the second ion well have a junction at their interface;

forming a gate overlying the first ion well and second ion well, wherein the gate has a first overlapping length with the first ion well, from the junction of the first and the second ion wells to the first sidewall of the gate, wherein the first overlapping length is between about 0.1 μm and about 0.3 μm, wherein the gate has a second overlapping length with the second ion well, from the junction of the first and the second ion wells to a second sidewall opposite to the first sidewall, and wherein the second overlapping length is greater than the first overlapping length;

forming a drain region and a source region of the first conductivity type in the first ion well and in the second ion well, respectively, wherein the drain region is spaced apart from a first sidewall of the gate, which is proximate to the first ion well, by an offset distance;

forming gate spacers on the first and second sidewalls of the gate;

forming a resist protect oxide layer over the spacer on the first sidewall and extending to a portion of the drain region;

forming a metal layer over the gate, the source region and the drain region; and performing a silicide process to the metal layer to form a silicide layer on the gate, the source region and another portion of the drain region that is not covered by the resist protect oxide layer.

* * * * *